(12) United States Patent
Miura et al.

(10) Patent No.: US 6,452,244 B1
(45) Date of Patent: Sep. 17, 2002

(54) FILM-LIKE COMPOSITE STRUCTURE AND METHOD OF MANUFACTURE THEREOF

(75) Inventors: Tadao Miura, Yokohama (JP); Touru Sumiya, Tokyo (JP); Shun-ichiro Tanaka, Yokohama (JP)

(73) Assignees: Japan Science and Technology Corporation, Kawaguchi (JP); Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/319,210

(22) PCT Filed: Dec. 3, 1997

(86) PCT No.: PCT/JP97/04417

§ 371 (c)(1),
(2), (4) Date: Aug. 10, 1999

(87) PCT Pub. No.: WO98/25308

PCT Pub. Date: Jun. 11, 1998

(30) Foreign Application Priority Data

Dec. 3, 1996 (JP) ................................. 8-337476

(51) Int. Cl.⁷ ........................ H01L 27/095; H01L 29/47
(52) U.S. Cl. ................. 257/471; 257/471; 257/472; 257/485; 257/486
(58) Field of Search ............................. 257/471, 472, 257/473, 485, 486, 9, 12, 23–30

(56) References Cited

U.S. PATENT DOCUMENTS

| | | | |
|---|---|---|---|
| 3,699,408 A | * 10/1972 | Shinoda et al. | 317/237 |
| 3,742,315 A | * 6/1973 | Lizuka et al. | 317/234 |
| 3,763,408 A | * 10/1973 | Kano et al. | 317/235 |
| 3,813,762 A | * 6/1974 | Kniepkamp | 29/589 |
| 4,062,033 A | * 12/1977 | Suzuki | 357/15 |
| 4,680,601 A | * 7/1987 | Mitlehner et al. | 357/15 |
| 4,816,879 A | * 3/1989 | Ellwanger | 357/15 |
| 5,898,210 A | * 4/1999 | Han et al. | 257/471 |

FOREIGN PATENT DOCUMENTS

| | | |
|---|---|---|
| JP | 62-193280 | 8/1987 |
| JP | 404236463 A | * 8/1992 |
| JP | 06077464 A | * 3/1994 |
| JP | 8-116072 | 5/1996 |
| JP | 09307120 A | * 11/1997 |
| JP | 411330499 A | * 11/1999 |

OTHER PUBLICATIONS

Olbrich et al., "Potential pinch–off effect in inhomogeneous Au/Co $GaAs_{67}P_{33}$(100)—Schottky contacts," Appl. Phys. Lett. (May 1997), 70:2559–61.

Anand et al., "Electron transport at Au/InP interface with nanoscopic exclusions," J. Vac. Sci. Technol. B (Jul./Aug. 1996), 14:2794–98.

dell'Orto et al., "Anomalous Au/Si barrier modification by a $CaF_2$ intralayer," The American Physical Society (Dec. 1994), 50:189–193.

R.T. Tung, "Schottky–Barrier Formation at Single–Crystal Metal–Semiconductor Interfaces", Physical Review Letters, vol. 52, No. 6, pp. 461–464, (1984).

* cited by examiner

Primary Examiner—Eddie Lee
Assistant Examiner—Joseph Nguyen
(74) Attorney, Agent, or Firm—Finnegan, Henderson, Farabow, Garrett & Dunner, L.L.P.

(57) ABSTRACT

On a semiconductor layer 1 consisting of a substrate of a semiconductor single crystal or the like, a metallic layer 2 of a thickness of 20 nm or less is formed. The metallic layer 2 comprises a first area A directly contacting with the semiconductor layer 1, and a second area B that is interposed by an intermediate layer 3 consisting of an insulator, a metal different from the metallic layer 2 or a semiconductor different from the semiconductor layer 1 between the semiconductor 1 and the metallic layer 2, and of a thickness of 10 nm or less. The first area and the second area are different in their Schottky currents, further in their Schottky barrier heights. Any one of the respective areas A and B has an area of nanometer level, and the respective interfaces in each of the areas A and B have an essentially uniform potential barrier, respectively. Such a film-like composite structure contributes to a minute semiconductor device of nanometer level and realization of a new functional device.

13 Claims, 4 Drawing Sheets

FILM-LIKE COMPOSITE STRUCTURE AND METHOD OF MANUFACTURE THEREOF

DESCRIPTION

Film-like composite structure and producing method thereof

1. Technical Field

The present invention relates to a film-like composite structure having a plurality of minute areas of different Schottky currents or Schottky barrier heights and producing method thereof.

2. Background Art

In a semiconductor device, various kinds of interfaces play a fundamental role for operation of the device. At the interfaces, there are potential variations and occur thermal non-equilibrium states of carriers. Among them, at a interface of a metal and a semiconductor, a potential barrier, namely, so-called Schottky barrier is known to occur. The Schottky barrier has a rectifying action. A rectifying metal-semiconductor junction, so-called Schottky junction has been used as a Schottky barrier diode, a Schottky gate transistor or the like, and constitutes a basis of semiconductor devices.

Although it is very important to control a Schottky barrier formed at a metal-semiconductor interface from design and production of the device points of view, a unified understanding of the formation mechanism of the barriers has not yet been obtained. In addition, upon connecting an electrode to an device, there is a metal-semiconductor interface. Accordingly, a non-rectifying ohmic contact is required to obtain, however, in general, it is extremely difficult to circumvent completely a rectifying barrier. Notwithstanding whether the Schottky barrier is used or the ohmic contact is used, it is essential to control the potential barrier at the metal-semiconductor interface. However, so far, there has been formed an interface level inevitably at the interface, accordingly it has been said that it is very difficult to control the Schottky barrier.

Further, when an interface is being formed, due to lattice defects, existence of impurities, interfacial reactions or the like on a surface of a semiconductor, it is difficult to form a uniform interface, that also makes difficult to control the potential barrier at the metal-semiconductor interface. This is partly due to an insufficient understanding of the formation process of the interface. To solve the aforementioned problem, an atomic level understanding and control of the formation process of the interface are essential.

As described above, so far, as Schottky barrier diodes, Schottky gate transistors or the like, various kinds of electronic devices which employ the Schottky barrier have been used. Those employ only an overall Schottky barrier at the metal-semiconductor interface, accordingly their usage has been restricted to such devices that control a current or an amount of electric charges by the whole interface.

Accordingly, it is demanded to, by controlling a potential barrier at a metal-semiconductor interface, produce an interface of a uniform potential barrier, and in addition to make an interface having areas of nanometer level of different potential barriers exist. If those were materialized, it would be expected that they would enable to produce minute semiconductor devices of nanometer level and develop further new functional devices such as mesoscopic devices or the like. However, until now, such an electronic device has not been found out.

On the other hand, as to the value of the Schottky barrier height itself, even for the same metal-semiconductor junctions, different values are reported depending on the state of the interface or the like. For example, in a $NiSi_2$/$Si(111)$ junction system, between the case where (111) face of Si and (111) face of $NiSi_2$ satisfy a complete epitaxial relation, and the case where they are in a twin relation, different values are reported for the value of the Schottky barrier height. In specific, whereas the former one is 0.65 eV, the latter one is 0.79 eV (R. T. Tung, Phys. Rev. Lett. 52, 461 (1984)). This is considered that there is difference between arrangements of Ni atoms and Si atoms at a interface and, this difference leads to the difference of the Schottky barrier height.

Although the aforementioned report shows that the Schottky barrier height differs depending on the difference of the interface structure, it postulates that the Schottky barrier heights in the measured junction area of the metal-semiconductor are the same. This only shows the difference of the Schottky barrier heights at the different metal-semiconductor junctions. Therefore, this does not show that, in a minute junction area of the metal-semiconductor, a plurality of areas of different Schottky barrier height exist. However, such a structure does not exceed the range of electronic devices using the conventional Schottky barrier.

As described above, the electronic devices of the conventional Schottky barrier make use of only the overall Schottky barrier height at the metal-semiconductor interface and a film structure where interfaces of different potential barrier exist with the area of nanometer level has not yet been obtained. From such a background, upon making semiconductor devices minute at the level of nanometer or realizing a new functional device, it is strongly demanded to control the potential barrier at the metal-semiconductor interface. In addition to preparation of the interfaces of a uniform potential barrier, a film-like composite structure where interfaces of different Schottky current and Schottky barrier height coexist at the area of nanometer level is demanded.

An object of the present invention is to provide, through realization of the control of the potential barrier of the metal-semiconductor interface, a film-like composite structure where a plurality of nanometer level areas of different Schottky currents and Schottky barrier heights exist in a minute area, and a producing method of the same.

DISCLOSURE OF INVENTION

A film-like composite structure of the present invention comprises a semiconductor layer having a flat portion, a metallic layer of a thickness of 20 nm or less formed on the flat portion of the semiconductor layer, and an intermediate layer of a thickness of 10 nm or less which is partly interposed between the semiconductor layer and the metallic layer and consisting of an insulator, a metal different from the metallic layer or a semiconductor different from the semiconductor layer. Here, the metallic layer has a first area contacting directly with the semiconductor layer, and a second area where the intermediate layer is interposed between the semiconductor layer and the metallic layer, and the Schottky barrier height is different from that of the first area, the first area and the second area each having an essentially uniform Schottky barrier height in each area, respectively.

In the film-like composite structure of the present invention, the first area and the second area are characterized in that the respective interfaces in the each area have an essentially uniform potential barrier, respectively.

In the film-like composite structure of the present invention, the second area can be disposed partly to the whole area of the metallic layer, for example, depending on the desired device pattern. The second area is formed according to the shape of the intermediate layer. For the specific shape of the intermediate layer, an island-like body of the maximum diameter of 100 nm or less, or a belt-like body of a width of 100 nm or less.

A producing method of a film-like composite structure of the present invention comprises a step of forming, on a semiconductor layer with a flat portion, an intermediate layer of a thickness of 10 nm or less consisting of an insulator, a first metal or a semiconductor different from the semiconductor layer, in an island-like or belt-like shape, and a step of forming, on the semiconductor layer having the intermediate layer, a metallic layer of a thickness of 20 nm or less consisting of a second metal different from the first metal, wherein on the semiconductor layer, a first area where the metallic layer and the semiconductor layer contact directly, and a second area where the intermediate layer is interposed between the metallic layer and the semiconductor layer, and the Schottky barrier height is different from that of the first area, are formed.

Upon forming a metal-semiconductor interface, in addition to the control of, for example, an initial surface of a substrate of a semiconductor single crystal, by controlling the formation of a metallic thin film, an insulator thin film or a semiconductor thin film at an atomic level, a potential barrier at an interface was found to be controllable. The present invention was accomplished based on such a finding.

That is, the density of surface state of a surface of a substrate of a semiconductor single crystal is reduced. Further, the surface of the semiconductor single crystal substrate is flattened at an atomic level, and, for the formation of an intermediate layer and a metallic layer, a molecular beam epitaxy (MBE: Molecular Beam Epitaxy) method, for example, is employed. The intermediate layer and metallic layer, after the initial surface being controlled in an ultra-high vacuum, are formed while controlling a substrate temperature or a vaporization speed. With these, the potential barrier of each interface can be controlled.

Based on the control of the potential barrier of the interface, in each of the first area where a metallic layer and a semiconductor layer contact directly, and the second area where an intermediate layer of a thickness of 10 nm or less is interposed between a metallic layer and a semiconductor layer, the interfaces of the respective areas have a uniform potential barrier, respectively. Schottky barrier height in each area mentioned above can be controlled independently. Then, the first area and the second area, there being a difference of an interface structure whether or not the intermediate layer exists therebetween, can be rendered areas of different Schottky barrier height.

On the other hand, an intermediate layer of a thickness of 10 nm or less consisting of a metal, and an insulator or a semiconductor, by making use of a terrace, for example, on a surface of a semiconductor layer, can be partly formed in a desired pattern such as an island or a stripe. Therefore, including on an intermediate layer like this, by forming a metallic layer to cover the surface of the semiconductor layer, a film-like composite structure having a plurality of areas of which the Schottky barrier height is different at a nanometer level can be obtained.

In such a film-like composite structure, for example, by the following way, the composite state of the minute areas of nanometer level can be confirmed. That is, after a film-like composite structure is produced in an ultra-high vacuum, without breaking the vacuum in the ultra-high vacuum, a ballistic electron emission microscopy (Ballistic Electron Emission Microscopy: BEEM) observation is carried out. Through the BEEM observation, the Schottky current and the Schottky barrier height are measured for each area. By thus practicing, the composite state of the minute areas of nano-level can be confirmed.

The film-like composite structure of the present invention makes use of the different Schottky currents and Schottky barrier heights in the aforementioned the first area and the second area. Thereby, the composite structure can be applied to various kinds of highly integrated functional devices including Schottky diodes or Schottky gate transistors finely fabricated on nanometer level.

For example, a tunnel current is injected from a probe to a metallic layer. Among electrons which reached a surface of the metallic layer, a part of the electrons (ballistic electrons) which reached, without scattering in the metallic layer, an interface between the metallic layer and a semiconductor layer goes over a potential barrier, so-called Schottky barrier, of the metal-semiconductor interface and flows to the semiconductor layer as a Schottky current (also called as a collector current or a BEEM current).

In particular, under a condition of the ballistic electrons sufficiently reaching the interface, with respect to the voltage input to the probe, from approximately the Schottky barrier height, the Schottky current increases drastically. Therefore, when the heights of the Schottky barriers of the first area and the second area are different, depending on the voltage (probe voltage) of the tunnel current flowing to the metallic layer, the current that flows to the semiconductor layer between the respective areas, that is, the Schottky current can be controlled. Further, even when the intermediate layer scatters the ballistic electrons strongly, similarly between the first area and the second area, the Schottky current can be controlled.

The film-like composite structure of the present invention can be applied even to a high-density memory device or the like which carries out reading by use of the difference of the BEEM current values of the nanometer areas. As described above, the film-like composite structure of the present invention has a possibility of developing and applying to various kinds of highly integrated functional devices.

BEST MODE FOR CARRYING OUT THE INVENTION

In the following, the best mode for carrying out the present invention will be described.

Figure 1:
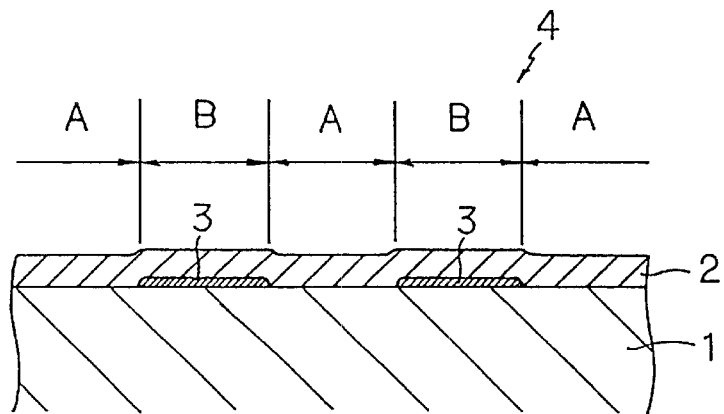
FIG. 1 is a cross-section showing schematically a structure of one embodiment of a film-like composite structure of the present invention.

FIG. 1 is a cross-section showing schematically a principal structure of a film-like composite structure of the present invention. In the same figure, reference number 1 denotes a semiconductor layer. For the semiconductor layer 1, single crystal substrates and epitaxial growth films of various kinds of semiconductors can be employed, that is, this material is not particularly restricted. As a specific example of the semiconductor layer 1, a Si single crystal substrate, a Ge single crystal substrate, a Si—Ge substrate, single crystal substrates of various kinds of compound semiconductors such as GaAs, GaSb, InP, ZnTe, CdCe, CdTe or the like, or epitaxial growth films of these various kinds of semiconductors can be cited.

On the semiconductor layer 1, a thin film of a metallic layer 2 of a thickness of 20 nm or less is formed. The constituting material of the metallic layer 2 is not also restricted particularly, various kinds of simple metals such as Au, Ag, Pt, Cu, Al or the like, or alloys thereof can be employed. The thickness of the metallic layer 2 is 20 nm or less. This is because, when the thickness of the metallic layer 2 is too much, notwithstanding the existence of the intermediate layer 3 which will be described later in detail, upon injection of ballistic electrons to a interface of metal (2)-semiconductor (1), the Schottky current (collector current/BEEM current) flowing to the semiconductor layer 1 becomes too small and the Schottky current can not be controlled enough.

The metallic layer 2 comprises a first area A directly contacting to a surface of the semiconductor layer 1, and a second area B where an intermediate layer 3 of a thickness of 10 nm or less is interposed between the semiconductor layer 2 and the metallic layer 2. With these first area A and second area B, a interface (metal-semiconductor interface) of metal (2)-semiconductor (1) is constituted.

In these first area A and second area B, an interface between a metallic layer 2 and a semiconductor layer 1, an interface between an intermediate layer 3 and the semiconductor layer 1 and an interface between the metallic layer 2 and the intermediate layer 3 in each area have essentially uniform potential barriers, respectively. These interfaces having the essentially uniform potential barriers can be confirmed by BEEM observation. That is, if the potential barriers of the interfaces of each area are essentially uniform, the BEEM image (picture showing measured result of the BEEM current) corresponding to the each area hardly shows a contrast. With the BEEM images, a state of an interface can be confirmed.

The interfaces having essentially uniform potential barriers can be obtained by, in addition to controlling an initial stage surface of the semiconductor layer 1, controlling the formation of the intermediate layer 3 or the metallic layer 2 at an atomic level. For example, a surface of a semiconductor layer 1 consisting of a substrate of a semiconductor single crystal, by carefully treating, can be reduced in its surface state density and flattened in its surface to the atomic level.

On the semiconductor layer 1 having such a surface as described above, with a film formation method such as a molecular beam epitaxy (MBE) method that enables, in addition to the control of the initial surface in an ultra-high vacuum, to control a substrate temperature and a vaporization speed when forming a thin film of a metal, a thin film of an insulator, a thin film of a semiconductor or the like, an intermediate layer 3 and further a metallic layer 2 can be formed. Thereby, the interfaces having essentially uniform potential barriers can be obtained, respectively. The intermediate layer 3 and the metallic layer 2 are preferable to be formed in an ultra-high vacuum such as $1 \times 10^{-7}$ Pa or less, in specific.

For the material of the intermediate layer 3, an insulator, a metal different from the metallic layer 2, or a semiconductor different from the semiconductor layer 1 can be employed. For the intermediate layer 3, other than positive interposition of the third material consisting of an insulator and a different kind of metal or semiconductor, a reaction layer between the metallic layer 2 and the semiconductor layer 1 can be employed. The thickness of the intermediate layer 3 is 10 nm or less. If the thickness of the intermediate layer 3 exceeds 10 nm, it is difficult to be processed according to a desired pattern.

The intermediate layer 3 is disposed partly to the interface of metal 2-semiconductor 1, that is, the whole area of the metallic layer 2. The shape of the intermediate layer 3, for example, by making use of a terrace on the surface of the semiconductor layer 1, can be formed according to the desired pattern.

That is, the intermediate layer 3 of a thickness of 10 nm or less, by making use of a flat terrace of the semiconductor layer 1 consisting of, for example, a substrate of a semiconductor single crystal, can be formed into island bodies of the maximum diameter of approximately 1 to 100 nm. Or, along a step, it can be formed in belt-like bodies of a width of approximately 1 to 100 nm. To cover only particular terraces, the intermediate layer 3 can be formed. The width of the terrace, by controlling an angle from a particular crystal face of the surface of the semiconductor layer 1 or by combining appropriately an oxidizing treatment in the air and a heat treatment in an ultra-high vacuum, can be controlled in the range of from several tens nm to several hundreds nm.

Thus, the intermediate layer 3, in addition to controlling the thickness down to 10 nm or less, by making use of the terraces or steps on the surface of the semiconductor layer 1, can be formed into island bodies of the maximum diameter of approximately 1 to 100 nm or belt-like bodies of the width of approximately 1 to 100 nm. The intermediate layer 3 can be formed with a desired pattern.

A film-like composite structure 4 of which the interfaces of the respective areas A and B have uniform potential barriers, respectively, after an intermediate layer 3 of a thickness of 10 nm or less is formed on a semiconductor layer 1, by forming continuously the metallic layer 2 with the aforementioned film formation method, is obtained. The Schottky currents and the Schottky barrier heights in each area A and B of the film-like composite structure 4 are as follows.

Figure 1A:
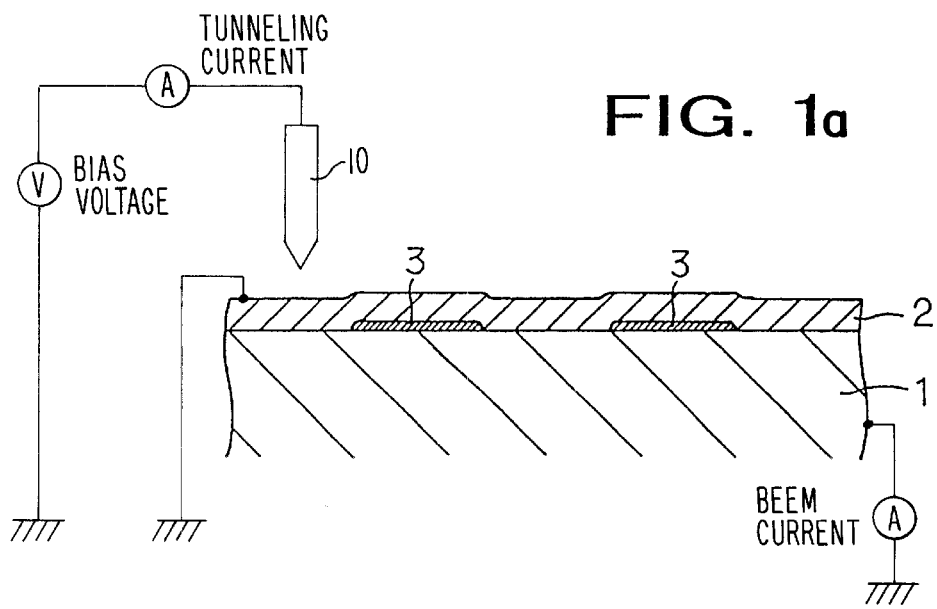
FIG. 1a is a cross-section showing schematically an STM apparatus and a film-like composite structure of the present invention.

For example, when a thin film of an insulator of a thickness of 10 nm or less is employed as the intermediate layer 3, of the interface of metal (2)-semiconductor (1), the first area A, since the semiconductor layer 1 and the metallic layer 2 are contacting directly, has a Schottky barrier height based on the semiconductor constituting the semiconductor layer 1 and the metal constituting the metallic layer 2. This Schottky barrier height, since the interfaces in the first area A have an essentially uniform potential barrier, is essentially uniform in the first area A. In the first area A described above, when a tunnel current is injected, for example, from a probe 10, as shown in FIG. 1a, to the metallic layer 2, the ballistic electrons flow to the semiconductor layer 1 as the Schottky current corresponding to the aforementioned Schottky barrier height.

On the other hand, the second area B, since an intermediate layer 3 consisting of an insulator is interposed between the semiconductor layer 1 and the metallic layer 2, is a metal (M)-insulator (I)-semiconductor (S) junction, accordingly, has a Schottky barrier height based on a so-called MIS junction. The Schottky barrier height based on the MIS junction, since the respective interfaces in the second area B have an essentially uniform potential barrier, is essentially uniform in the second area B. In such the second area B as described above, the tunnel current injected to the metallic layer 2 flows to the semiconductor layer 1 as the Schottky current corresponding to the Schottky barrier height based on the MIS junction. Or, when the intermediate layer 3 consisting of an insulator scatters, for example, the ballistic electrons strongly, the Schottky current itself does not flow.

Further, when the intermediate layer 3 is constituted of a metal different from the metallic layer 2, the metal-semiconductor interface between the metal constituting the intermediate layer 3 and the semiconductor layer 1 dominates the Schottky barrier height of the second area B. Therefore, in the second area B, when the tunnel current is injected to the metallic layer 2, according to the Schottky barrier height based on the interface between the metal different from the metallic layer 2 and the semiconductor layer 1, the current flows to the semiconductor layer 1 as the Schottky current. That is, the second area B has the Schottky barrier height and the Schottky current different from those of the first area A.

Further, when the intermediate layer 3 is constituted of a semiconductor different from the semiconductor layer 1, the metal-semiconductor interface between the semiconductor constituting this intermediate layer 3 and the metallic layer 2 dominates the Schottky barrier height in the second area B. Therefore, in such the second area B, when the tunnel current is injected to the metallic layer 2, according to the Schottky barrier height based on the interface between the metallic layer 2 and the semiconductor different from the semiconductor layer 1, the current flows to the semiconductor layer 1 as the Schottky current. That is, the second area B has the Schottky barrier height and the Schottky current different from those of the first area A.

Thus, in a film-like composite structure 4 in which the intermediate layer 3 is partly disposed between the metallic layer 2 and the semiconductor layer 1, the Schottky currents and the Schottky barrier heights of the first area A and the second area B can be controlled. In specific, to the first area A and the second area B, by injecting the tunnel current, for example, from a probe to the metallic layer 2, the Schottky currents can be controlled between each area A and B. That is, a plurality of minutes areas (the first area A and the second area B) of nanometer level of which the Schottky currents and the Schottky barrier heights are different can be made to exist in the interface (metal-semiconductor interface) of metal (2)-semiconductor (1).

The film-like composite structure that is described above, by making use of the different Schottky currents and the Schottky barrier heights in the first area A and the second area B, can be applied to various kinds of highly integrated devices including Schottky diodes and Schottky gate transistors finely fabricated to nanometer level, and, further, by making use of the difference of the BEEM current values of the nanometer areas, can be applied to the new functional devices such as high density memory devices and mesoscopic devices carrying out the reading out.

Next, the specific example that confirmed, by the BEEM observation, that in the interface of metal (2)-semiconductor (1) the minute first areas A and second areas B of nanometer level exist as described above will be described.

First, with a Si (111) substrate as a semiconductor layer 1, on a surface of the Si(111) substrate, a Au film is formed in an ultra-high vacuum of $1 \times 10^{-7}$ Pa or less. The formation of the Au film and evaluation thereof, in order to decrease the absorption, from the atmosphere, of oxygen, water, organic materials, or the like which disturb the control of the surface and interface, and the measurement, is carried out in a device that can accomplish all the processes from the film formation to the evaluation in an ultra-high vacuum.

The above described device has first a film formation room in which a molecular beam epitaxy (MBE) method of excellent controllability is employed. To the film formation room, an STM preparation room is connected through a sample transferring room. The STM preparation room is connected to an STM room. The STM room has an STM observation means and a BEEM observation means. In the STM preparation room, an electrode attachment step for the BEEM measurement can be carried out. The processes from the film formation to the STM observation and BEEM observation that are described above are carried out under an ultra-high vacuum of $2 \times 10^{-8}$ Pa or less.

Figure 2:
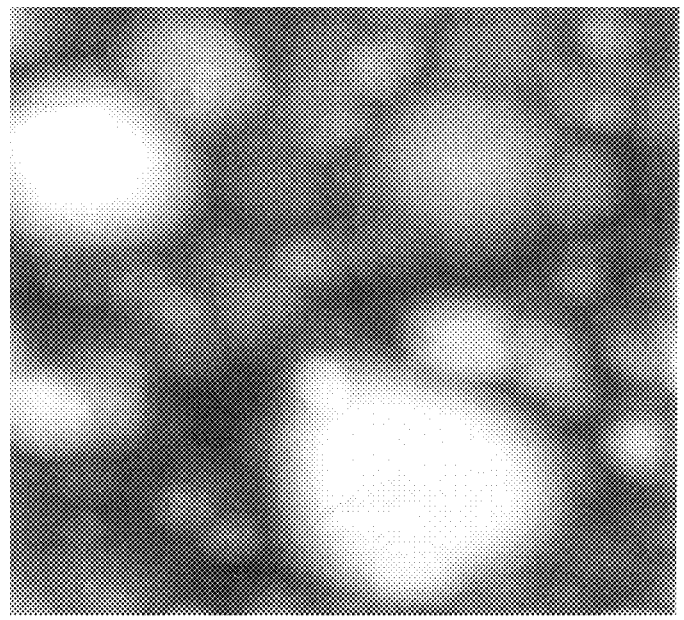
FIG. 2 is a STM photograph of a Au film shown as a confirmed result of each area in a film-like composite structure of the present invention.
Figure 3:
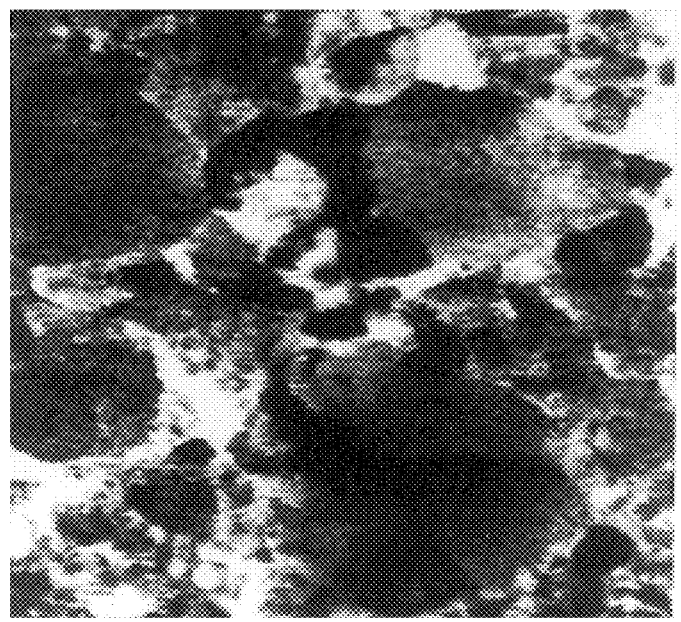
FIG. 3 is a BEEM photograph of the same place with the STM photograph shown in FIG. 2.

With the aforementioned ultra-high vacuum film formation-evaluation device, with a (7×7) surface of a Si(111) substrate as a film formation surface, on this clean Si(111) (7×7) surface, a Au film of a thickness of 3.0 nm is formed by use of the MBE method. The substrate temperature during the film formation, influenced by a Au evaporating source, was approximately 423K. Subsequently, with the ultra-high vacuum film formation-evaluation device, of the same places of the Au film, the STM observation and the BEEM observation were carried out. The STM image is shown in FIG. 2 and the BEEM image is shown in FIG. 3. The observed area is 100 nm×100 nm. The BEEM image was given a contrast according to the intensity of the BEEM current.

As being obvious from the STM image shown in FIG. 2, Au grows in island shape of various sizes. In the BEEM, since the ballistic electrons reaching the interface decrease as the film thickness increases, the BEEM current also decreases as the increase of the film thickness. Accordingly, in the large islands, compared with the small islands, the BEEM current becomes small.

Figure 4:
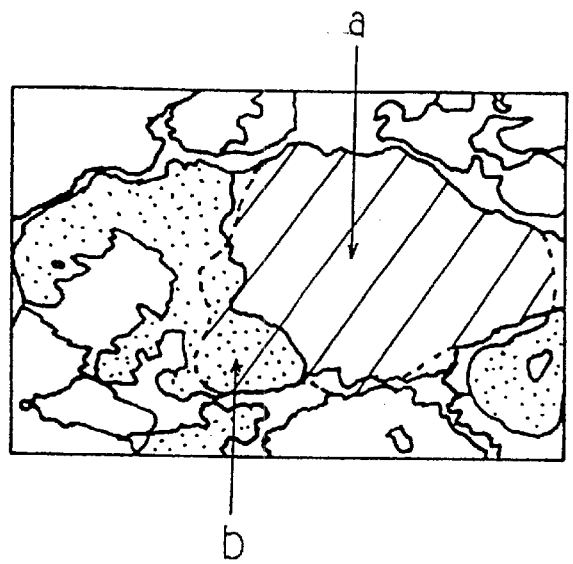
FIG. 4 is a diagram showing schematically a part of the BEEM photograph of the Au film shown in FIG. 2.

The BEEM image shown in FIG. 3 corresponding the above, shows the contrast that is roughly reversed the STM image. However, in the BEEM image, within portions corresponding to the island-like portions of the STM image, black areas, that is, areas of extremely low BEEM current existed. This state is shown schematically in FIG. 4. FIG. 4 shows schematically a part of the BEEM image shown in FIG. 3, and the dotted area is the black area. Further, the hatched area in FIG. 4 shows island-like portion due to the STM image of the same place.

Figure 5:
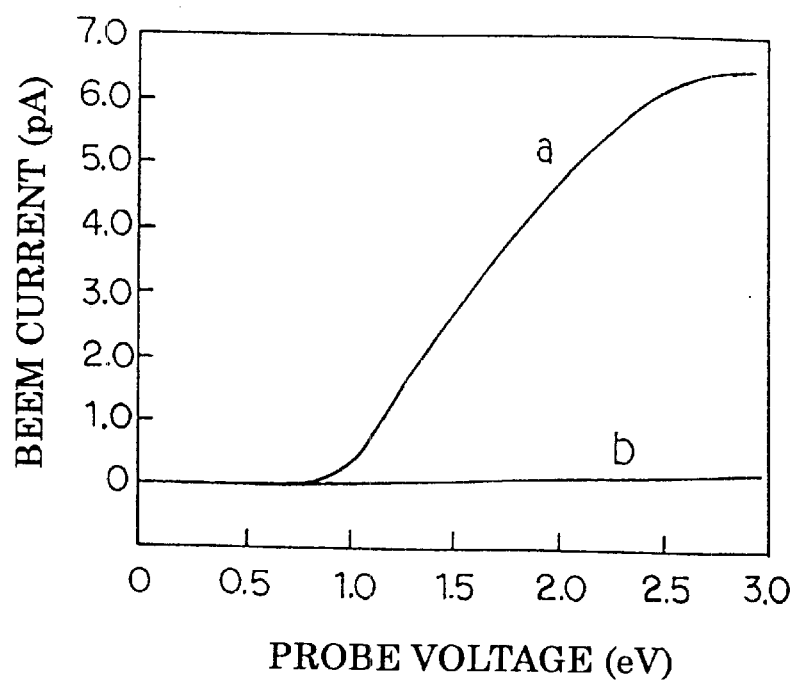
FIG. 5 is a diagram showing measured results of BEEM spectra of a Au-Si interface of the Au film shown in FIG. 2 and an interface having a Au—Si reaction product.

As to the essential island area of Au (the part shown with an arrow mark a in FIG. 4/other part than the black area) and the black area (the part shown with an arrow mark b in FIG. 4), probe voltage dependence of the BEEM current, so-called BEEM spectra were evaluated. The results are shown in FIG. 5. In the area a, the spectrum showed the rise up of the BEEM current from approximately 0.8 eV, the Schottky barrier height of the Au/Si (111). On the other hand, in the area b, notwithstanding the increase of the electron energy, the BEEM current did not increase.

The reason why, in the area b, contrary to the ordinary Au/Si (111) interface, the BEEM current did not increase is considered due to the existence of the reaction products of Au and Si in the Au/Si(111) interface. This is because, since the substrate temperature was elevated up to approximately 423 K during the film formation, due to this substrate temperature, Au and Si reacted at the low temperature. This understanding was confirmed by the fact that, when the above specimen was annealed again under the condition of 573 K and 30 min to enhance the reaction at the interface, over the whole surface of the specimen, the BEEM current became below the detection limit. When the layer of the reaction product of Au and Si exists at the interface, since the ballistic electrons are scattered strongly when going through the layer of the reaction product, the BEEM current (Schottky current) hardly flows.

The fact that there exist a plurality of areas of different BEEM currents, like the aforementioned area a and area b, at the metal-semiconductor interface could not be found by the STM observation only. It was not until the concurrent use of the STM observation and the BEEM observation that a plurality of areas of different BEEM currents were specified.

Thus, by making partly exist the layer of the reaction product of Au and Si at the interface, an area where the other impurity does not exist at the Au/Si (111) interface (corresponding to the first area A in FIG. 1), and an area where the Au—Si reaction product exists at the interface (corresponding to the second area B in FIG. 1) can be obtained. The interface structure gives rise to a film-like composite structure having a plurality of areas of different Schottky currents. The production of the Au—Si reaction product at the Au/Si (111) interface can be controlled by the surface state of the Si (111) substrate, the substrate temperature during film formation or the like. Therefore, the area where the Au—Si reaction product which corresponds to the second area of the present invention exists at the interface, can be obtained in the controlled state.

However, the state and area of production of the aforementioned Au—Si reaction product can be controlled less. So in the following, an example in which, by controlling the surface state of the Si substrate and the substrate temperature during film formation, without giving existence to the impurity such as the Au—Si reaction product at the Au/Si (111) interface, the Au film consisting of only Au/Si (111) interface is formed, will be described.

First, a Si (111)·(7×7) DAS (Dimar Adatom Stacking Fault) structure includes many dangling bonds. In order to control the low temperature reaction of Au—Si, this dangling bond, being chemically active, is preferred not to exist. So, as the initial state of the Au growth, a Si (111)·($3^{1/2} \times 3^{1/2}$)·Au surface was employed.

Where an amount of vaporization of Au is two molecular layers or less, even if the substrate is heated to approximately 973 K, Au atoms, without giving rise to the low temperature reaction with Si atoms, cooperate with the Si atoms to form a stable rearrangement state on the surface. Further, when the amount of vaporization is approximately 1.5 molecular layers (the film thickness of 0.2 nm), at the substrate temperature of approximately 573 K, a ($3^{1/2} \times 3^{1/2}$) structure is obtained. Now, after Au is first formed in a film of a thickness of about 0.2 nm at the substrate temperature of 573 K, the substrate is once cooled down to the room temperature in the transferring room to suppress the low temperature reaction of Au—Si, and the Au is again introduced into the MBE room to form a film of a thickness of 3.0 nm.

Upon carrying out the STM observation and BEEM observation of the obtained Au film, it is confirmed from the STM image that the Au exists as island bodies of approximately 10 nm. The BEEM image of this island-like Au film hardly has a contrast, in addition, from the typical BEEM spectrum of the inside thereof, the spectrum is observed to rise up from approximately 0.8 eV. From these, the lack of the contrast of the BEEM image can be understood that the intensity of the BEEM current is uniform. Accordingly, it is confirmed that the potential barriers of the interfaces in the island-like Au film are essentially uniform, and the Schottky barrier heights at the interface are essentially uniform.

The aforementioned island-like Au film can be used as the intermediate layer 3 of the film-like composite structure 4 shown in FIG. 1, and by forming, on the Si substrate including this island-like Au film, another metallic layer, for example, a Ag layer of a thickness of approximately 10 nm, the film-like composite structure 4 shown in FIG. 1 can be obtained.

Next, considering the aforementioned result of the film formation of the Au film, the preparation example of the film-like composite structure 4 where the third substance is interposed as the intermediate layer 3 and evaluation results thereof will be described. Incidentally, the steps from the film formation to the evaluation of the respective films were carried out in the aforementioned ultra-high vacuum film formation-evaluation device.

Embodiment 1

First, with a Si (111)·(7×7) substrate as a semiconductor layer 1, the area of a terrace on a surface of the Si substrate is controlled to approximately 50 nm by an oxidizing treatment in the air and a heat treatment in an ultra-high vacuum. On the surface of the clean Si (111)·(7×7) substrate having such a terrace, first, while controlling the substrate temperature at 303 K, a Au film of a thickness of 1 nm is formed by the MBE method. Subsequently, with the substrate temperature controlling at 303 K, a Ag film of 10 nm is formed with the MBE method. Here, the Au film is formed as the intermediate layer 3, and the Ag film formed thereon is the metallic layer 2.

The STM observation and BEEM observation were carried out on such a composite film. As the result of this, it is confirmed that the Au film exists as the island-like bodies on the terrace, further, and an area where Ag forms an interface with the Si substrate, and an area where a Au intermediate layer exists and the Au forms an interface with the Si substrate, coexist. It is confirmed from the BEEM image that the potential barrier of the each interface is essentially uniform.

Figure 6:
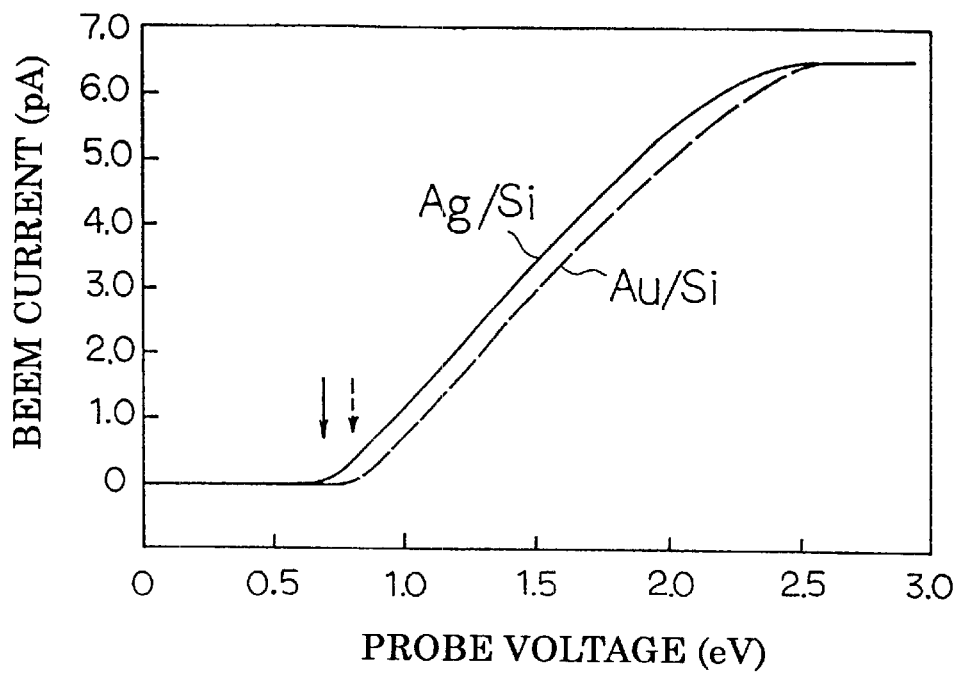
FIG. 6 is a diagram showing measured results of BEEM spectra of a Ag—Si interface and a Au—Si interface of a film-like composite structure according to one embodiment of the present invention.

Further, in FIG. 6, the result of the BEEM spectrum measurement of the Ag—Si interface area, and the result of the BEEM spectrum measurement of the Au—Si interface area, are shown. In the Ag—Si interface area, the BEEM current rises up from approximate 0.7 eV that is the Schottky barrier height of Ag—Si, on the other hand, in the Au—Si interface area, the BEEM current rises up from approximate 0.8 eV that is the Schottky barrier height of Au—Si. From this, it is confirmed that a plurality of areas of different Schottky barrier heights coexist.

Embodiment 2

With a Si (111)·(7×7) substrate as a semiconductor layer 1, on a surface of the clean Si (111)·(7×7) substrate, first while controlling the substrate temperature at 973 K, a film of $CaF_2$, an insulating material, of a thickness of 1 nm is formed by the MBE method. The $CaF_2$ film was found to grow like a belt from the step. Then, with controlling the substrate temperature at 303 K, a Au film of 5.0 nm is formed including on the $CaF_2$ film by the MBE method. Here, the $CaF_2$ film is formed as the intermediate layer 3, and the Au film formed thereon is the metallic layer 2.

Upon carrying out the observation of such a composite film with the STM and BEEM, the coexistence of an area where the Au and the Si substrate form an interface directly, and an area where the belt-like $CaF_2$ film of a thickness of 1 nm is interposed at the Au—Si interface is confirmed. From the BEEM spectra of the respective areas, the Schottky barrier heights of the respective areas are confirmed to be different, each other.

Embodiment 3

With a Si (111)·(7×7) substrate as a semiconductor layer 1, the area of the terrace on the surface of the Si substrate is controlled to approximate 50 nm by an oxidizing treatment in the air and a heat treatment in an ultra-high vacuum. On a surface of the clean Si (111)·(7×7) substrate having such a terrace, while controlling first the substrate temperature at 773 K, a film of $CaF_2$, an insulating material, of a thickness of 1 nm is formed by the MBE method. Then, the substrate temperature is controlled at 303 K, a Au film of a thickness of 5.0 nm is formed including on the $CaF_2$ film. Here, the $CaF_2$ film was formed as the intermediate layer 3, and the Au film formed thereon is the metallic layer 2.

Upon carrying out the STM observation and BEEM observation on such a composite film, it was confirmed that the $CaF_2$ film exists as the island-like bodies on the terrace, and that an area where the $CaF_2$ film of a thickness of 1 nm is interposed at the Au—Si interface, and an area where the Au forms an interface directly with the Si substrate, coexist. From the BEEM spectrum of each area, it is confirmed that the Schottky barrier height of each area is different.

Industrial Applicability

According to the film-like composite structure of the present invention and the producing method thereof, a plurality of minute areas of different Schottky currents and Schottky barrier heights can be incorporated in a metal-semiconductor interface. The film-like composite structure having such a metal-semiconductor interface can be applied to various kinds of functional devices including the highly integrated Schottky diode and Schottky gate transistor, and to the high density memory devices carrying out the reading out by making use of the difference of the BEEM current values of the nanometer areas.

What is claimed is:

1. A film-like composite structure, comprising:
    a semiconductor layer having a flat portion;
    a metallic layer of a thickness of 20 nm or less formed on the flat portion of the semiconductor layer; and
    an intermediate layer of a thickness of 10 nm or less that is interposed in part between the semiconductor layer and the metallic layer, and consists of an insulator;
    wherein the metallic layer has a first area contacting directly with the semiconductor layer, and a second area where the intermediate layer is interposed between the semiconductor layer and the metallic layer, and a Schottky barrier height is different from that of the first area;
    wherein the first and second areas each have an essentially uniform Schottky barrier height in each area, respectively.

2. The film-like composite structure as set forth in claim 1:
wherein an interface of the semiconductor layer and the metallic layer in the first area and an interface of the semiconductor layer and the intermediate layer in the second area have essentially uniform potential barriers, respectively.

3. The film-like composite structure as set forth in claim 1:
wherein the second area is disposed partly on the whole area of the metallic layer.

4. The film-like composite structure as set forth in claim 1:
wherein the intermediate layer has a maximum diameter of 100 nm or less.

5. The film-like composite structure as set forth in claim 1:
wherein the intermediate layer has a width of 100 nm or less.

6. A producing method of a film-like composite structure, comprising:
a step of forming an intermediate layer of a thickness of 10 nm or less on a part of a semiconductor layer having a flat portion, the intermediate layer consisting of an insulator; and
a step of forming a metallic layer of a thickness of 20 nm or less on the semiconductor layer having the intermediate layer;
wherein a first area where the metallic layer and the semiconductor layer contact directly, and a second area where the intermediate layer is interposed between the metallic layer and the semiconductor layer, and a Schottky barrier height different from that of the first area, are formed on the semiconductor layer.

7. The producing method of a film-like composite structure as set forth in claim 6:
wherein the intermediate layer and the metallic layer are formed so that each Schottky barrier height in the first area and the second area is essentially uniform, respectively.

8. The producing method of a film-like composite structure as set forth in claim 6:
wherein the intermediate layer has a maximum diameter of 100 nm or less.

9. The producing method of a film-like composite structure as set forth in claim 6:
wherein the intermediate layer has a width of 100 nm or less.

10. The film-like composite structure as set forth in claim 1:
wherein ballistic electrons are injected into the first and second areas, respectively.

11. The film-like composite structure as set forth in claim 10:
wherein when a bias voltage of a Schottky barrier height or more is inputted, ballistic electron currents due to the ballistic electrons in the first area and the second area are different.

12. The film-like composite structure as set forth in claim 1:
wherein the film-like composite structure is a structure employed for an highly integrated device.

13. A highly integrated functional device comprising:
the film-like composite structure as set forth in claim 1; and
a probe injecting a tunnel current to the metallic layer so as to inject ballistic electrons into the first area and the second area of the film-like composite structure, respectively;
wherein the highly integrated functional device is controlled based on ballistic electron currents different between the first area and the second area when a bias current of the Schottky barrier height or more is injected to the metallic layer.

* * * * *